United States Patent
Lee et al.

(10) Patent No.: US 6,876,082 B2
(45) Date of Patent: Apr. 5, 2005

(54) REFRACTORY METAL NITRIDE BARRIER LAYER WITH GRADIENT NITROGEN CONCENTRATION

(75) Inventors: Hsien-Ming Lee, Changhua (TW); Shing-Chuang Pan, Tainan (TW); Chung-Shi Liu, Hsin-chu (TW); Chen-Hua Yu, Hsin-chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 118 days.

(21) Appl. No.: 10/214,638

(22) Filed: Aug. 8, 2002

(65) Prior Publication Data

US 2004/0029377 A1 Feb. 12, 2004

(51) Int. Cl.⁷ .............................................. H01L 23/48
(52) U.S. Cl. ..................... 257/763; 257/741; 257/750; 438/652

(58) Field of Search .................................. 257/758, 778, 257/751, 763, 765, 756, 734, 741, 750, 785; 438/637, 652

(56) References Cited

U.S. PATENT DOCUMENTS

| | | | |
|---|---|---|---|
| 6,139,699 A | 10/2000 | Chiang et al. | |
| 6,140,231 A | 10/2000 | Lin et al. | |
| 6,168,991 B1 * | 1/2001 | Choi et al. | 438/254 |
| 6,174,798 B1 * | 1/2001 | Hsia et al. | 438/625 |
| 6,268,288 B1 | 7/2001 | Hautala et al. | |
| 2003/0186087 A1 * | 10/2003 | Liou et al. | 428/698 |

* cited by examiner

Primary Examiner—Brad Smith
(74) Attorney, Agent, or Firm—Tung & Associates

(57) ABSTRACT

Within a microelectronic fabrication and a method for fabricating the microelectronic fabrication a barrier layer is formed over a substrate. Within the method and the microelectronic fabrication the barrier layer is formed of a refractory metal nitride barrier material having within its thickness a gradient in nitrogen concentration. The barrier layer has low resistivity and improved electromigration performance.

8 Claims, 2 Drawing Sheets

REFRACTORY METAL NITRIDE BARRIER LAYER WITH GRADIENT NITROGEN CONCENTRATION

BACKGROUND OF THE INVENTION

1. Field of the Invention

The present invention relates generally to refractory metal nitride layers within microelectronic fabrications. More particularly, the present invention relates to refractory metal nitride layers with enhanced performance within microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased and patterned microelectronic conductor layer dimensions have decreased, it has become increasingly common in the art of microelectronic fabrication to fabricate within microelectronic fabrications patterned microelectronic conductor layers formed of copper containing conductor materials. Patterned microelectronic conductor layers formed within microelectronic fabrications of copper containing conductor materials are desirable in the art of microelectronic fabrication insofar as copper containing conductor materials have generally enhanced electrical properties in comparison with other conductor materials which may be employed for forming patterned microelectronic conductor layers within microelectronic fabrications.

While copper containing conductor materials are thus desirable in the art of microelectronic fabrication for forming patterned micorelectronic conductor layers within microelectronic fabrications, copper containing conductor materials are nonetheless not entirely without problems in the art of microelectronic fabrication for forming patterned microelectronic conductor layers within microelectronic fabrications.

In that regard, patterned microelectronic conductor materials formed of copper containing conductor materials within microelectronic fabrications are often susceptible to interdiffusion with adjoining microelectronic materials formed within microelectronic fabrications. Similarly, while barrier layers and barrier materials are known in the art of microelectronic fabrication for inhibiting interdiffusion of copper containing conductor materials within microelectronic fabrications, use of such barrier materials often compromises electrical performance of microelectronic fabrications.

It is thus desirable in the art of microelectronic fabrication to provide methods and materials for forming within microelectronic fabrications patterned microelectronic conductor layers formed of copper containing conductor materials, with inhibited interdiffusion and enhanced performance.

It is towards the foregoing object that the present invention is directed.

Various microelectronic conductor structures having desirable properties, and methods for fabrication thereof, have been disclosed in the art of microelectronic fabrication.

Included among the microelectronic conductor structures and methods for fabrication thereof, but not limiting among the microelectronic conductor structures and methods for fabrication thereof, are microelectronic conductor structures and methods for fabrication thereof disclosed within: (1) Chiang et al., in U.S. Pat. No. 6,139,699 (a method for forming, with inhibited physical stress, a tantalum or tantalum nitride barrier layer for use within a microelectronic conductor structure, by varying, as appropriate, process variables within a sputtering method employed for forming the tantalum or tantalum nitride barrier layer); (2) Lin et al., in U.S. Pat. No. 6,140,231 (a method for forming, with inhibited interdiffusion, a copper containing conductor structure within a microelectronic fabrication, by forming within the copper containing conductor structure a tantalum nitride barrier layer formed as a bilayer tantalum nitride barrier layer with misaligned grain boundaries); and (3) Hautala et al., in U.S. Pat. No. 6,268,288 (a method for forming, with improved microstructure properties and reduced resistivity, a tantalum nitride barrier layer for use within a microelectronic conductor structure, by treating a chemical vapor deposition (CVD) deposited tantalum nitride barrier layer with a hydrogen plasma).

Desirable in the art of microelectronic fabrication are additional methods and materials which may be employed in the art of microelectronic fabrication for forming, with inhibited interdiffusion and enhanced performance microelectronic conductor structures within microelectronic fabrications.

It is towards the foregoing object that the present invention is directed.

SUMMARY OF THE INVENTION

A first object of the present invention is to provide a conductor structure for use within a microelectronic fabrication and a method for fabricating the conductor structure for use within the microelectronic fabrication.

A second object of the present invention is to provide the conductor structure and the method for fabricating the conductor structure in accord with the first object of the present invention, wherein the conductor structure has inhibited interdiffusion and enhanced performance such as improved electromigration resistance.

A third object of the present invention is to provide a conductor structure and a method for fabricating the conductor structure in accord with the first object of the present invention and the second object of the present invention, wherein the conductor structure is readily fabricated.

In accord with the objects of the present invention, there is provided by the present invention a barrier layer for use within a conductor structure for use within a microelectronic fabrication and a method for fabricating the barrier layer for use within the conductor structure for use within the microelectronic fabrication.

In accord with the present invention, the barrier layer comprises a refractory metal nitride barrier material having within its thickness a gradient in nitrogen concentration.

Within the present invention, when a barrier layer in accord with the present invention is employed as a barrier layer with respect to a copper containing conductor layer within a microelectronic conductor structure, the microelectronic conductor structure is formed with inhibited interdiffusion and enhanced performance.

The present invention provides a barrier layer for use within a microelectronic conductor structure for use within a microelectronic fabrication, wherein the microelectronic fabrication is fabricated with inhibited interdiffusion and enhanced performance.

The present invention realizes the foregoing objects by forming the barrier layer of a refractory metal nitride barrier material having within its thickness a gradient in nitrogen concentration.

A microelectronic conductor structure within a microelectronic fabrication having formed therein a barrier layer in accord with the present invention is readily fabricated.

As will be discussed in greater detail within the context of the Description of the Preferred Embodiment, as set forth below, a barrier layer fabricated in accord with the present invention may be fabricated employing methods as are generally conventional in the art of microelectronic fabrication, but employed within the context of specific process limitations to provide a barrier layer of composition in accord with the instant invention.

Since it is thus at least in part specific process limitations within the context of available process tooling which provides at least in part the present invention, rather than the existence of process tooling which provides the present invention, a microelectronic conductor structure within a microelectronic fabrication having formed therein a barrier layer in accord with the present invention is readily fabricated.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a barrier layer for use within a microelectronic conductor structure for use within a microelectronic fabrication, wherein the microelectronic fabrication is fabricated with inhibited interdiffusion and enhanced performance.

The present invention realizes the foregoing objects by forming the barrier layer of a refractory metal nitride barrier material having within its thickness a gradient in nitrogen concentration.

While the preferred embodiment of the present invention illustrates the present invention within the context of a barrier layer formed within a dual damascene aperture and in turn having formed thereupon a copper containing conductor layer within a microelectronic fabrication, the present invention nonetheless provides value within the context of barrier layers whether or not they are formed within apertures within microelectronic fabrications and whether or not they have formed thereupon copper containing conductor layers. The present invention may be employed for forming barrier layers within dual damascene apertures (with or without etch stop layers) as well as single damascene apertures.

Figure 1:
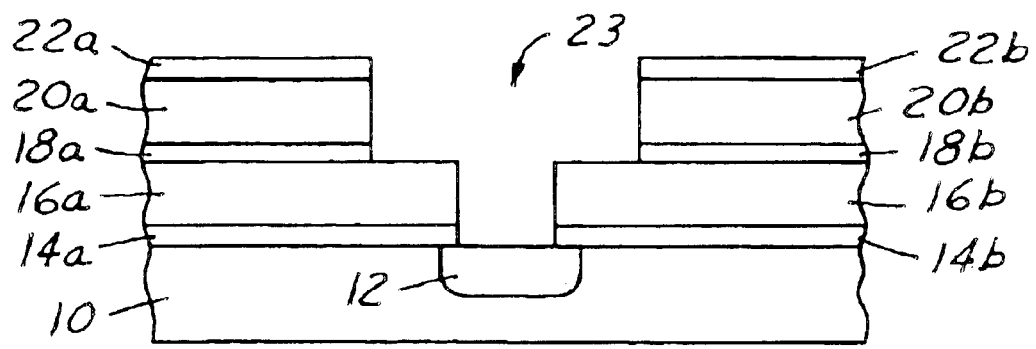
FIG. 1, FIG. 2 and FIG. 3 show a series of schematic cross-sectional diagrams illustrating the results of progressive stages of forming, in accord with a preferred embodiment of the present invention, a microelectronic fabrication having formed therein a barrier layer in accord with the present invention.
Figure 2:
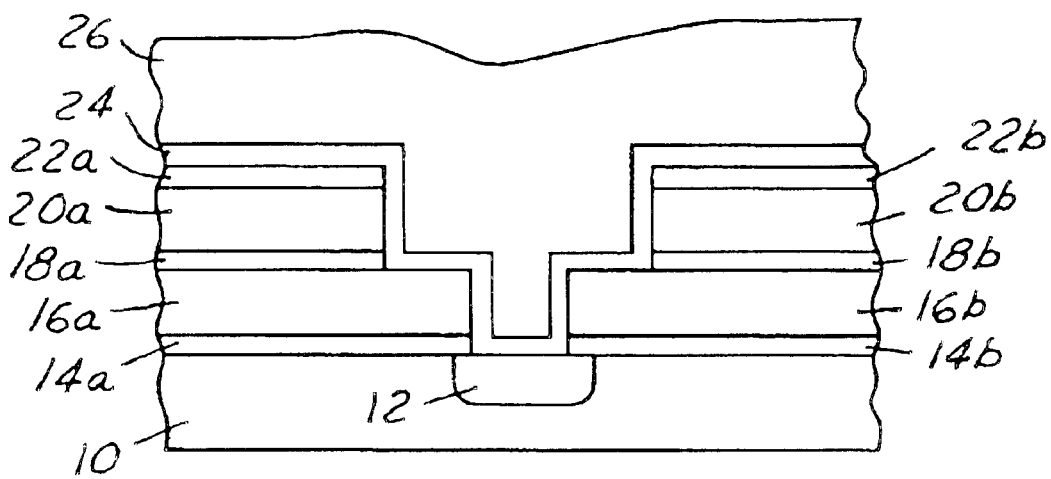
Figure 3:
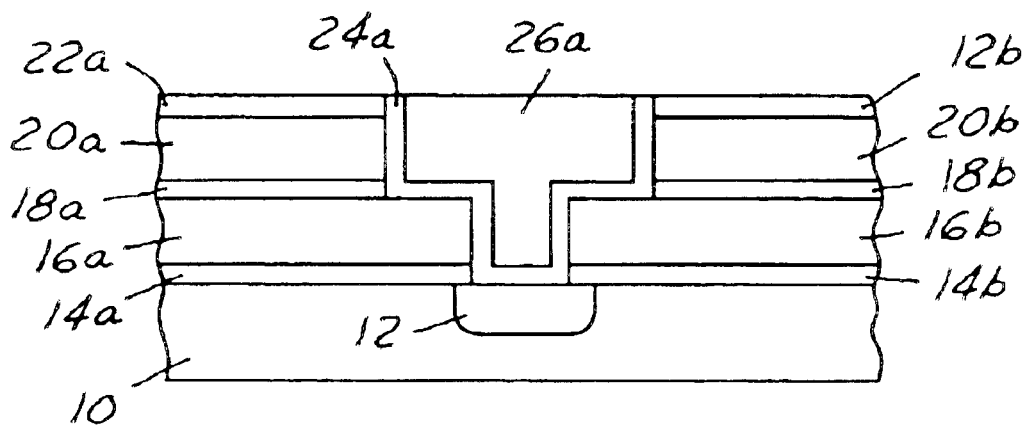

Referring now to FIG. 1 to FIG. 3, there is shown a series of schematic cross-sectional diagrams illustrating the results of progressive stages of fabricating, in accord with a preferred embodiment of the present invention, a microelectronic fabrication having formed therein a barrier layer in accord with the present invention.

Shown in FIG. 1 is a schematic cross-sectional diagram of the microelectronic fabrication at an early stage in its fabrication in accord with the preferred embodiment of the present invention.

Shown in FIG. 1, in a first instance, in a substrate 10 having formed therein a contact region 12.

Within the preferred embodiment of the present invention with respect to the substrate 10, the substrate 10 may be employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Although not specifically illustrated within the schematic cross-sectional diagram of FIG. 1, the substrate 10 may consist of a substrate alone as employed within the microelectronic fabrication, or in an alternative, the substrate 10 may comprise a substrate as employed within the microelectronic fabrication, where the substrate has formed thereupon and/or thereover any of several additional microelectronic layers as are conventional within the microelectronic fabrication within which is employed the substrate. Similarly with the substrate alone as employed within the microelectronic fabrication, such additional microelectronic layers may be formed from microelectronic materials selected from the group including but not limited to microelectronic conductor materials, microelectronic semiconductor materials and microelectronic dielectric materials.

Similarly, and although also not specifically illustrated within the schematic cross-sectional diagram of FIG. 1, typically and preferably, but not exclusively, when the substrate 10 consists of or comprises a semiconductor substrate as employed within a semiconductor integrated circuit microelectronic fabrication, has formed therein and/or thereupon microelectronic devices as are conventional in the art of microelectronic fabrication within which is employed the substrate. Such microelectronic devices may be selected from the group including but not limited to resistors, transistors, diodes and capacitors.

Within the preferred embodiment of the present invention with respect to the contact region 12, the contact region 12 is typically and preferably either: (1) a semiconductor substrate contact region under circumstances where the substrate 10 consists of or comprises a semiconductor substrate; or (2) a conductor contact region under circumstances where the substrate is employed within any of the above enumerated microelectronic fabrications.

Shown also within the schematic cross-sectional diagram of FIG. 1, and formed successively upon or over the substrate 10 having formed therein the contact region 12, is a series of patterned layers comprising: (1) a pair of patterned dielectric barrier layers 14a and 14b formed upon the substrate 10 having formed therein the contact region 12; (2) a pair of patterned first inter-metal dielectric layers 16a and 16b formed aligned upon the pair of patterned dielectric barrier layers 14a and 14b; (3) a pair of patterned etch stop layers 18a and 18b formed upon the pair of patterned first inter-metal dielectric layers 16a and 16b and further separated than the pair of patterned first inter-metal dielectric layers 16a and 16b; (4) a pair of patterned second inter-metal dielectric layers 20a and 20b formed aligned upon the pair of patterned etch stop layers 18a and 18b; and (5) a pair of patterned planarizing stop layers 22a and 22b formed aligned upon the pair of patterned second inter-metal dielectric (IMD) layers 20a and 20b.

Within the preferred embodiment of the present invention with respect to the pair of patterned dielectric barrier layers 14a and 14b, the pair of patterned etch stop layers 18a and 18b and the pair of patterned planarizing stop layers 22a and 22b, each of the pair of patterned dielectric barrier layers 14a and 14b, the pair of patterned etch stop layers 18a and 18b and the pair of patterned planarizing stop layers 22a and 22b is typically and preferably formed of a dense dielectric material, such as but not limited to a dense silicon nitride dielectric material, a dense silicon oxynitride dielectric material or a dense silicon carbide dielectric material, although the pair of patterned planarizing stop layers 22a and 22b is generally formed of a different material than the pair of patterned dielectric barrier layers 14a and 14b and the pair of patterned etch stop layers 18a and 18b.

Typically and preferably: (1) the pair of patterned dielectric barrier layers 14a and 14b is formed of a silicon carbide dielectric material or a silicon nitride dielectric material formed to a thickness of from about 200 to about 750 angstroms; (2) the pair of patterned etch stop layers 18a and 18b is formed of a silicon carbide dielectric material or a silicon nitride dielectric material formed to a thickness of from about 200 to about 750 angstroms; and (3) the pair of patterned planarizing stop layers 22a and 22b is formed of a silicon oxynitride dielectric material formed to a thickness of from about 300 to about 1800 angstroms.

Within the preferred embodiment of the present invention with respect to the pair of patterned first inter-metal dielectric (IMD) layers 16a and 16b and the pair of patterned second inter-metal dielectric layers 20a and 20b, each of the pair of patterned first inter-metal dielectric layers 16a and 16b and the pair of patterned second inter-metal dielectric layers 20a and 20b may be formed from any of several types of dielectric materials as are conventional in the art of microelectronic fabrication, including but not limited to generally higher dielectric constant silicon oxide dielectric materials (having a dielectric constant of from about 4.0 to about 5.0) and generally lower dielectric constant dielectric materials (having a dielectric constant of from about 2.0 to about 4.0) such as but not limited to spin-on-glass (SOG) dielectric materials, spin-on-polymer (SOP) dielectric materials, amorphous carbon dielectric materials and fluorosilicate glass (FSG) dielectric materials.

Typically and preferably, each of the pair of patterned first dielectric layers 16a and 16b is formed to a thickness of from about 1800 to about 8000 angstroms and each of the pair of patterned second inter-metal dielectric (IMD) layers 20a and 20b is formed to a thickness of from about 2500 to about 11000 angstroms.

As is understood by a person skilled in the art, the foregoing series of patterned layers provides within the microelectronic fabrication whose schematic cross-sectional diagram is illustrated in FIG. 1 a dual damascene aperture 23 comprising a via defined by the pair of patterned dielectric barrier layers 14a and 14b and the pair of patterned first inter-metal dielectric layers 16a and 16b, the via being overlapped by a trench of greater linewidth as defined by the pair of patterned etch stop layers 18a and 18b, the pair of patterned second inter-metal dielectric (IMD) layers 20a and 20b and the pair of patterned planarizing stop layers 22a and 22b.

Referring now to FIG. 2, there is shown a schematic cross-sectional diagram illustrating the results of further processing of the microelectronic fabrication whose schematic cross-sectional diagram is illustrated in FIG. 1.

Shown in FIG. 2 is a schematic cross-sectional diagram of a microelectronic fabrication otherwise equivalent to the microelectronic fabrication whose schematic cross-sectional diagram is illustrated in FIG. 1, but wherein there is formed conformally upon exposed surfaces of the foregoing series of patterned layers, and within the dual damascene aperture 23 while also contacting the contact region 12, a blanket conductor barrier layer 24. Finally, there is also shown within the schematic cross-sectional diagram of FIG. 1, and formed upon the blanket conductor barrier layer 24, a blanket conductor layer 26.

Within the present invention and the preferred embodiment of the present invention, the blanket conductor barrier layer 24 provides at least in part the present invention, and the specifics of fabrication and composition of the blanket conductor barrier layer 24 are disclosed in greater detail below. Within the preferred embodiment of the present invention with respect to the blanket conductor layer 26, although the blanket conductor layer 26 may be formed from any of several conductor materials as are conventional in the art of microelectronic fabrication, including but not limited to aluminum, aluminum alloys, copper and copper alloys, the present invention provides particular value under circumstances where the blanket conductor layer 26 is formed of a copper or copper alloy (having a copper content of greater than about 85 weight percent) copper containing conductor material. Typically and preferably, the blanket conductor layer is formed to a thickness of from about 5000 to about 15000 angstroms.

Referring now to FIG. 3, there is shown a schematic cross-sectional diagram illustrating the results of further processing of the microelectronic fabrication whose schematic cross-sectional diagram is illustrated in FIG. 2.

Shown in FIG. 3 is a schematic cross-sectional diagram of a microelectronic fabrication otherwise equivalent to the microelectronic fabrication whose schematic cross-sectional diagram is illustrated in FIG. 2, but wherein the blanket conductor barrier layer 24 and the blanket conductor layer 26 have been planarized to form within the dual damascene aperture 23 a patterned conductor barrier layer 24a having formed thereupon a patterned contiguous conductor interconnect and conductor stud layer 26a.

Within the preferred embodiment of the present invention, the blanket conductor barrier layer 24 and the blanket conductor layer 26 may be planarized to form the patterned conductor barrier layer 24a and the patterned contiguous conductor interconnect and conductor stud layer 26a while employing planarizing methods as are conventional in the art of microelectronic fabrication, including in particular chemical mechanical polish (CMP) polish planarizing methods.

Upon forming the microelectronic fabrication whose schematic cross-sectional diagram is illustrated in FIG. 3, there is formed a microelectronic fabrication in accord with the preferred embodiment of the present invention. The microelectronic fabrication has formed therein a barrier layer which provides inhibited interdiffusion with respect to the contiguous patterned conductor interconnect and patterned conductor stud layer 26a, as well as enhanced performance, such as improved electromigration performance, of the microelectronic conductor structure within the microelectronic fabrication.

Within the present invention and the preferred embodiment of the present invention, the blanket conductor barrier layer 24 is formed of a refractory metal nitride material, such as but not limited to a titanium nitride, a tungsten nitride, a tantalum nitride or a zirconium nitride refractory metal nitride material (as well as silicides (i.e. silicon nitrides) thereof), but most particularly a tantalum nitride refractory metal nitride material. Within the present invention, the refractory metal nitride material has a graded concentration of nitrogen, and in particular a lower concentration of nitrogen adjacent or adjoining the patterned contiguous conductor interconnect and conductor stud layer 26a and a higher concentration of nitrogen adjacent or adjoining the pair of patterned first inter-metal dielectric (IMD) layers 16a and 16b and the pair of patterned second inter-metal dielectric (IMD) layers 20a and 20b.

Typically and preferably, the comparatively higher concentration of nitrogen adjacent or adjoining the pair of patterned first inter-metal dielectric (IMD) layers 16a and 16b and the pair of patterned second inter-metal dielectric layers 20a and 20b is provided at a concentration which provides a substantially stoichiometric concentration of nitrogen (i.e. within about 10 percent of a 1:1 titanium, tungsten or tantalum to nitrogen atomic ratio) refractory metal nitride material, while the lower concentration of nitrogen of the refractory metal nitride material formed adjacent or adjoining the contiguous patterned conductor interconnect and patterned conductor stud layer 26a has from about 20 to about 80 percent less (more preferably from about 30 to about 70 less and most preferably from about 40 to about 60 less) than a stoichiometric or substantially stoichiometric concentration of nitrogen (i.e., a titanium, tungsten or tantalum to nitrogen atomic ratio of from about 1:0.8 to about 1:0.2 (more preferably from about 1:0.7 to about 1:0.3 and most preferably from about 1:0.4 to about 1:0.6). The nitrogen deficient portion of the blanket conductor barrier layer 24 may have further formed thereupon a refractory metal base layer corresponding with the refractory metal within the refractory metal nitride material. Typically and preferably, the blanket conductor barrier layer 24 has a substantially stoichiometric thickness portion of from about 400 to about 50 angstroms and a nitrogen deficient thickness portion of from about 300 to about 30 angstroms, as well as an optional (but generally preferred) refractory metal base material thickness portion of from about 100 to about 30 angstroms.

A nitrogen graded refractory metal nitride material for use within the blanket conductor barrier layer 24 in accord with the present invention may be formed employing any of several methods as are conventional in the art of microelectronic fabrication. Such methods may include, in particular, reactive sputtering physical vapor deposition (PVD) methods which employ sputtering of, for example, a tantalum target within a nitrogen and argon containing sputter atmosphere of varying concentration. Such methods may also include chemical vapor deposition (CVD) methods employing various refractory metal halide source materials, as well as other vaporizable refractory metal source materials, in conjunction with varying concentrations of nitrogen source materials such as but not limited to ammonia.

The nitrogen graded refractory metal nitride material for use within the blanket conductor barrier layer 24 may be continuously graded (through appropriate continuous adjustment of deposition parameters (i.e., nitrogen flow rate), or discontinuously graded (through appropriate step wise adjustment of deposition parameters).

Within the preferred embodiment of the present invention, reactive sputtering physical vapor deposition (PVD) methods are generally preferred for forming the blanket conductor barrier layer of a refractory metal nitride materials of graded nitrogen concentration and composition. Typically and preferably, such reactive sputtering methods employ: (1) a reactor chamber pressure and a radio frequency power of from about 1000 to about 2500 watts of from about $18 \times 10^{-3}$ to about $36 \times 10^{-3}$ torr; (2) a bias sputtering power of from about 0 to about 500 watts per square centimeter of substrate area; (3) a substrate temperature of from about 50 to about 350 degrees centigrade; (4) an argon sputtering component at a flow rate of about 25 to about 65 standard cubic centimeters per minute (sccm); and (5) a nitrogen flow rate of from about 16 to about 25 standard cubic centimeters per minute (sccm) for forming a substantially stoichiometric refractory metal nitride material and from about 1 to about 16 standard cubic centimeters per minute (sccm) for forming a nitrogen deficient refractory metal nitride material.

EXAMPLES

In order to illustrate the value of the present invention, there was fabricated three series of microelectronic fabrications generally in accord with the microelectronic fabrication whose schematic cross-sectional diagram is illustrated in FIG. 3, but wherein there was formed within each of the three series of microelectronic fabrications a patterned conductor barrier layer formed of one of three different compositions. A first of the three different compositions was a tantalum nitride barrier layer formed in accord with the present invention, wherein the tantalum nitride barrier layer was formed of a substantially stoichiometric tantalum nitride material layer of thickness about 90 angstroms, having formed thereupon a nitrogen deficient tantalum nitride material layer of tantalum:nitrogen atomic ratio about 1:0.3 of thickness about 130 angstroms, in turn having formed thereupon a tantalum material layer formed to a thickness of about 30 angstroms. A second of the three different compositions was a tantalum nitride barrier layer formed of a substantially stoichiometric tantalum nitride material layer of thickness about 190 angstroms having formed thereupon a tantalum layer of thickness of about 60 angstroms. A third of the three different compositions was a substantially stoichiometric tantalum nitride material layer only, formed to a thickness of from about 250 angstroms.

Each of the foregoing three different compositions of the three series of barrier layers was formed employing a reactive sputtering physical vapor deposition (PVD) method employing: (1) a reactor chamber pressure of about 30 torr; (2) a bias sputtering power of about 400 watts per square centimeter of substrate area; (3) a substrate temperature of about 150 degrees centigrade; (4) an argon sputtering component flow rate of about 55 standard cubic centimeters per minute (sccm); and (5) a nitrogen flow rate of about 22 standard cubic centimeters per minute (sccm), in order to form the substantially stoichiometric tantalum nitride material layers. A nitrogen flow rate was reduced to about 8 standard cubic centimeters per minute (sccm) to form the nitrogen deficient titanium nitride material layer and was entirely eliminated to form the tantalum material layer.

There was then measured for each of the three series of microelectronic fabrications having formed therein each of the three different barrier layer compositions, a contact resistance, while employing methods as are otherwise generally conventional in the art of microelectronic fabrication.

Figure 4:
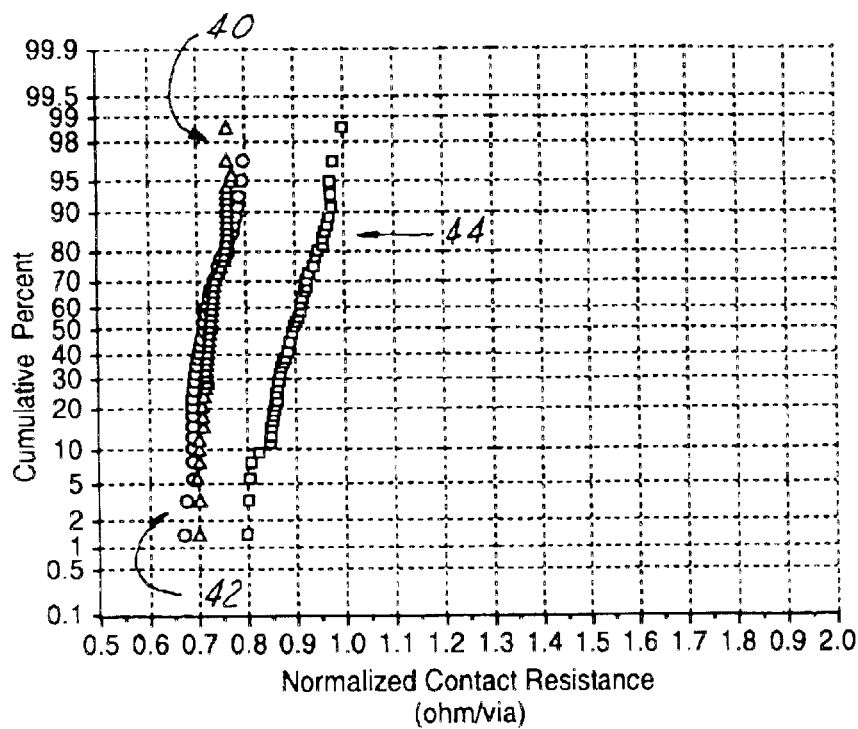
FIG. 4 shows a graph of Cumulative Percent versus Contact Resistance for a series microelectronic fabrications having formed therein a series of barrier layers both in accord with the present invention and not in accord with the present invention.

The measured values of the contact resistances are reported in FIG. 4, where: (1) the data points which correspond with reference numeral 40 correspond with contact resistances for copper containing conductor layers formed upon barrier layers in accord with the present invention; (2) the data points which correspond with reference numeral 42 correspond with contact resistances for copper containing conductor layers formed upon barrier layers formed of the substantially stoichiometric tantalum nitride material laminated with a tantalum material; and (3) the series of data points which corresponds with reference numeral 44 corresponds within contact resistances for copper containing conductor layers formed upon barrier layers formed of substantially stoichiometric tantalum nitride materials only.

As is illustrated within the graph of FIG. 4, microelectronic fabrications having formed therein barrier layers in accord with the present invention perform approximately equivalently with microelectronic fabrications having formed therein barrier layers formed of a tantalum nitride/tantalum laminate, either of which has considerably lower contact resistance than a microelectronic fabrication formed employing a barrier layer formed of tantalum nitride alone.

The series of three microelectronic fabrications having formed therein three different barrier layer material compositions was then subjected to an elevated thermal stress at a temperature of about 340 degrees centigrade and an electrical stress at a current density of about 2.5E6 Å/cm$^2$. There was then determined, while also employing methods as are conventional in the art of microelectronic fabrication, thermal stress induced failure rates for the threes series of microelectronic fabrications.

Figure 5:
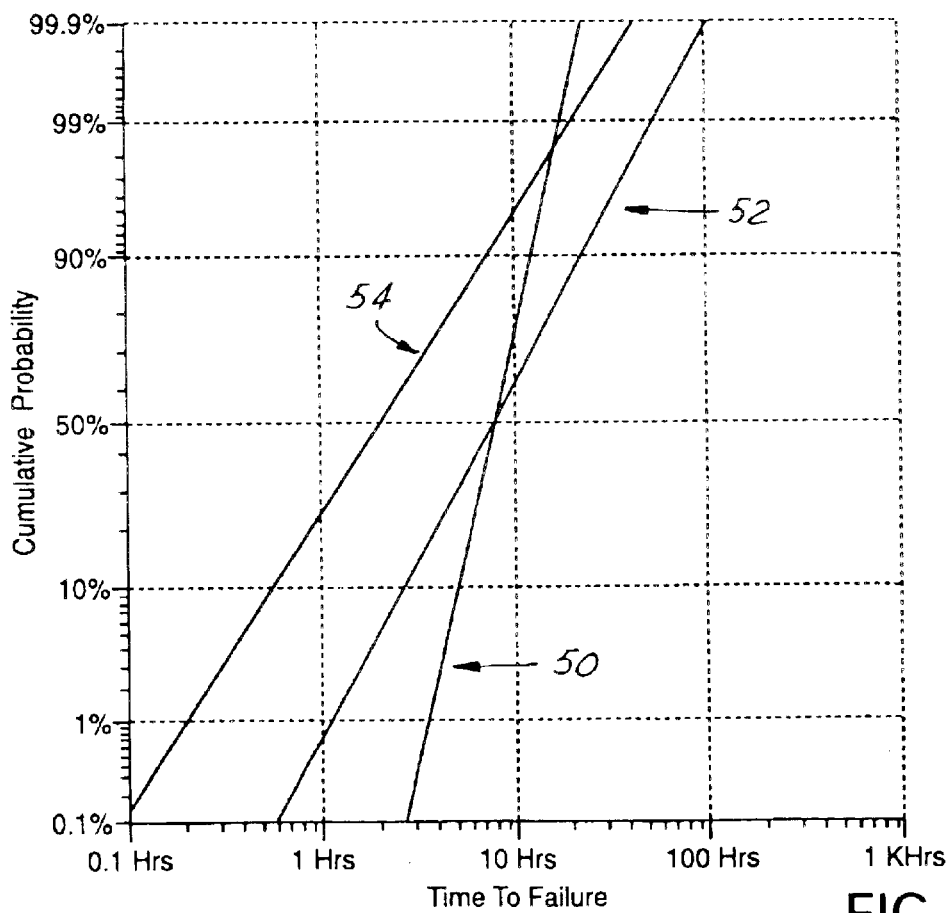
FIG. 5 shows a graph of Cumulative Probability versus Time to Failure for a series of microelectronic fabrications having formed therein a series of barrier layers both in accord with the present invention and not in accord with the present invention.

Comparative failure rates are illustrated in FIG. 5, where: (1) the line which correspond with reference numeral 50 corresponds with failure characteristics for microelectronic fabrications having formed therein barrier layers in accord with the present invention; (2) the line which corresponds with reference numeral 52 corresponds with failure characteristics for microelectronic fabrications having formed therein substantially stoichiometric tantalum nitride/tantalum laminated barrier layers; and (3) and the line which corresponds with reference numeral 54 corresponds with failure characteristics for microelectronic fabrications having formed therein substantially stoichiometric tantalum nitride barrier layers only.

As is seen from review of the data illustrated within the graph of FIG. 5, microelectronic fabrications having formed therein nitrogen graded barrier layers of composition in accord with the present invention provide superior short term failure characteristics in comparison with microelectronic fabrications having formed therein alternative barrier layer compositions. Such short term failures characteristics may be related to enhanced electromigration resistance characteristics.

While not wishing to be bound to any particular theory of operation of the present invention, it is believed that barrier layer constructions in accord with the present invention provide for an inhibited delamination therefrom of copper containing conductor layers formed thereupon.

As is understood by a person skilled in the art, the preferred embodiment and examples of the present invention are illustrative of the present invention rather than limiting of the present invention. Revisions and modifications may be made to methods, materials, structures and dimensions employed for forming within a microelectronic fabrication a conductor structure having formed therein a barrier layer in accord with the present invention, while still providing a microelectronic fabrication having formed therein a conductor structure having formed therein a barrier layer in accord with the present invention, further in accord with the accompanying claims.

What is claimed is:

1. A microelectronic fabrication comprising:
    a substrate; and
    a barrier layer formed over the substrate, the barrier layer comprising a refractory metal nitride barrier material having within its thickness a gradient in nitrogen concentration, wherein the gradient encompasses a substantially stoichiometric refractory metal nitride barrier material composition at a first side of the barrier layer and a nitrogen deficient refractory metal nitride barrier material composition a metal:nitrogen atomic ratio of from about 1:0.8 to about 1:0.2 at an opposite second side of the barrier layer.

2. The microelectronic fabrication of claim 1 further comprising a dielectric layer adjacent the first side of the barrier layer and a copper containing conductor layer adjacent the second side of the barrier layer.

3. The microelectronic fabrication of claim 2 further comprising a refractory metal layer formed upon the second side of the barrier layer and interposed between the second side of the barrier layer and the copper containing conductor layer.

4. The microelectronic fabrication of claim 1 wherein the refractory metal nitride barrier material is selected from the group consisting of titanium and titanium silicide.

5. The microelectronic fabrication of claim 1 wherein the refractory metal nitride barrier material is selected from the group consisting of tungsten and tungsten silicide.

6. The microelectronic fabrication of claim 1 wherein the refractory metal nitride barrier material is tantalum silicide.

7. The microelectronic fabrication comprising:
    a substrate; and
    a barrier layer formed over the substance, the barrier layer comprising a refractory metal nitride barrier material having within its thickness a gradient in nitrogen concentration, wherein the gradient encompasses a substantially stoichiometric refractory metal barrier material composition formed to a thickness of from about 50 to about 400 angstroms; and at a first side of the barrier layer and a nitrogen deficient refractory metal nitride barrier material composition formed to a thickness of from about 300 to about 30 angstroms, at an opposite second side of the barrier layer.

8. The microelectronic fabrication comprising:
    a substrate; and
    a barrier layer formed over the substance, the barrier layer comprising a refractory metal nitride barrier material having within its thickness a gradient in nitrogen concentration, wherein a refractory metal employed within the refractory metal nitride barrier material is selected from the group consisting of zirconium and zirconium silicide.

* * * * *